United States Patent
Shi

(10) Patent No.: US 10,644,159 B2
(45) Date of Patent: May 5, 2020

(54) ARRAY SUBSTRATE, METHOD FOR MANUFACTURING ARRAY SUBSTRATE, AND DISPLAY DEVICE

(71) Applicant: Shenzhen China Star Optoelectronics Technology Co., Ltd., Shenzhen (CN)

(72) Inventor: Longqiang Shi, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/908,047

(22) PCT Filed: Dec. 14, 2015

(86) PCT No.: PCT/CN2015/097242
§ 371 (c)(1),
(2) Date: Feb. 15, 2018

(87) PCT Pub. No.: WO2017/080013
PCT Pub. Date: May 18, 2017

(65) Prior Publication Data
US 2018/0190812 A1 Jul. 5, 2018

(30) Foreign Application Priority Data
Nov. 9, 2015 (CN) .......................... 2015 1 0755212

(51) Int. Cl.
*H01L 29/786* (2006.01)
*H01L 51/10* (2006.01)
(Continued)

(52) U.S. Cl.
CPC .......... *H01L 29/786* (2013.01); *H01L 27/127* (2013.01); *H01L 27/1225* (2013.01);
(Continued)

(58) Field of Classification Search
CPC . H01L 33/0041; H01L 27/124; H01L 29/458; H01L 21/02554; H01L 21/02565;
(Continued)

(56) References Cited

U.S. PATENT DOCUMENTS

2005/0134754 A1* 6/2005 Yang ................. G02F 1/136227
349/43
2009/0212290 A1* 8/2009 Youn .................... H01L 33/0041
257/59
(Continued)

FOREIGN PATENT DOCUMENTS

CN 102655095 A 9/2012
CN 103219391 A 7/2013
(Continued)

OTHER PUBLICATIONS

Notification of Transmittal of the International Search Report and the Written Opinion of the International Searching Authority (Forms PCT/ISA/210, PCT/ISA/237, and PCT/ISA/220) dated Aug. 15, 2016, by the State Intellectual Property Office of People's Republic of China in corresponding International Application No. PCT/CN2015/097242. (10 pages).
(Continued)

*Primary Examiner* — Brian Turner

(57) ABSTRACT

Disclosed is an array substrate, a method for manufacturing the array substrate, and a display device. The array substrate includes: a plurality of pixel units arranged in an array, each pixel unit being provided with one thin film transistor including an active layer and a polymer film on array. The polymer film on array is formed with a first via hole, and the active layer is conductive in a region thereof corresponding to the first via hole, such that a pixel electrode located on the polymer film on array is electrically connected to the source through the first via hole.

3 Claims, 3 Drawing Sheets

(51) Int. Cl.
*H01L 27/12* (2006.01)
*H01L 29/66* (2006.01)
*H01L 27/32* (2006.01)
*H01L 51/00* (2006.01)
*H01L 29/45* (2006.01)
*H01L 21/77* (2017.01)

(52) U.S. Cl.
CPC ...... *H01L 27/1248* (2013.01); *H01L 27/1259* (2013.01); *H01L 27/3248* (2013.01); *H01L 27/3258* (2013.01); *H01L 29/45* (2013.01); *H01L 29/66742* (2013.01); *H01L 29/66969* (2013.01); *H01L 29/7869* (2013.01); *H01L 51/002* (2013.01); *H01L 51/102* (2013.01); *H01L 21/77* (2013.01); *H01L 27/124* (2013.01); *H01L 27/3262* (2013.01); *H01L 51/0017* (2013.01)

(58) Field of Classification Search
CPC ............... H01L 21/02628; H01L 29/24; H01L 29/78603; H01L 29/7869; H01L 29/66969; G02F 2001/13685
See application file for complete search history.

(56) References Cited

U.S. PATENT DOCUMENTS

| | | | |
|---|---|---|---|
| 2010/0163865 A1* | 7/2010 | Arai | ...................... H01L 27/124 257/43 |
| 2011/0241003 A1* | 10/2011 | Yamazaki | ........... H01L 27/1225 257/59 |
| 2011/0294244 A1* | 12/2011 | Hattori | ................ H01L 27/1218 438/34 |
| 2012/0025320 A1* | 2/2012 | Chen | ................... H01L 27/1225 257/369 |
| 2012/0143568 A1* | 6/2012 | Kagan | .................. A61N 1/0529 702/189 |
| 2012/0309136 A1 | 12/2012 | Zhou et al. | |
| 2015/0214373 A1 | 7/2015 | Zhang et al. | |
| 2016/0172389 A1* | 6/2016 | Kao | .................... H01L 29/7869 257/66 |
| 2016/0300852 A1* | 10/2016 | Park | ..................... H01L 27/124 |
| 2016/0351643 A1 | 12/2016 | Xie | |

FOREIGN PATENT DOCUMENTS

| | | |
|---|---|---|
| CN | 103337522 A | 10/2013 |
| CN | 104362125 A | 2/2015 |

OTHER PUBLICATIONS

Office Action dated Aug. 18, 2017, by the State Intellectual Property Office of People's Republic of China in corresponding Chinese Patent Application No. 201510755212.5. (7 pages).

* cited by examiner

ARRAY SUBSTRATE, METHOD FOR MANUFACTURING ARRAY SUBSTRATE, AND DISPLAY DEVICE

CROSS-REFERENCE TO RELATED APPLICATIONS

The present application claims the priority of Chinese patent application CN 201510755212.5, entitled "Array substrate, method for manufacturing array substrate, and display device" and filed on Nov. 9, 2015, the entirety of which is incorporated herein by reference.

FIELD OF THE INVENTION

The present disclosure relates to the field of display technologies, and in particular, to an array substrate, a method for manufacturing the array substrate, and a display device.

BACKGROUND OF THE INVENTION

In a thin film transistor-active matrix liquid crystal display (TFT-AMLCD) device or a TFT-active matrix organic light-emitting diode (TFT-AMOLED) device, a source 5 of a TFT is connected to a pixel electrode 6, so as to transmit a data signal to the pixel electrode 6, thereby enabling the device to normally display an image.

As shown in FIG. 1, in the TFT-AMLCD, each pixel unit includes, from bottom up, a gate 1, a gate insulation layer 2, an active layer 3 corresponding to the gate 1, the source 5 and a drain 4 that are located on a same layer and connected to each other by means of the active layer 3, and the pixel electrode 6 electrically connected to the source 5. After the drain 4 receives the data signal, the active layer 3, driven by the gate 1, activates the source 5 and the drain 4, so that the data signal to which the drain 4 is connected is transmitted to the pixel electrode 6 through the source 5. Therefore, good contact between the source 5 and the pixel electrode 6 is very important. In addition, a buffer layer 8 may be provided between the gate 1 and a base substrate 7.

As shown in FIG. 1, many products incorporate a polymer film on array 9 (PFA) in a manufacturing process of an array substrate. Specifically, the source 5 and the drain 4 are covered with a first insulation layer 10, and the PFA, formed after the formation of the first insulation layer 10, facilitates subsequent procedures of the array substrate.

During manufacture of the array substrate, after the PFA is formed, a common electrode 11 is formed on the PFA, and a second insulation layer 12 is formed on the common electrode 11, followed by formation of the pixel electrode 6 finally.

In order for the pixel electrode 6 located in an uppermost layer to be electrically connected to the source 5, it is necessary to provide a via hole 13 which penetrates the second insulation layer 12, the PFA, and the first insulation layer 10 in sequence from the top down, so that the source 5 is partially exposed to be electrically connected to the pixel electrode 6.

The PFA can react with a metal material of the source 5, to form a nonconductive substance. In the prior art, the via hole 13 is etched layer by layer, i.e., the first insulation layer 10 is etched after being formed, and the PFA is formed after formation of the via hole 13. Such being the case, the PFA can be brought into contact with a portion of the source 5 exposed by the via hole 13, to form a nonconductive substance on said portion of the source 5. This affects electrical connection between the source 5 and the pixel electrode 6 and lowers yield of the display device.

SUMMARY OF THE INVENTION

The present disclosure aims to provide an array substrate, a method for manufacturing the array substrate, and a display device, thereby ensuring electrical connection between a source and a pixel electrode in an effective manner.

According to a first aspect of the present disclosure, an array substrate is provided, comprising: a plurality of pixel units arranged in an array, each pixel unit being provided with one thin film transistor including a source and a drain that are located in a same layer, and an active layer connecting and partially covering the source and the drain; and a polymer film on array covering the active layer, wherein the polymer film on array is formed with a first via hole, and the active layer is conductive in a region thereof corresponding to the first via hole, such that a pixel electrode located on the polymer film on array is electrically connected to the source through the first via hole.

Optionally, the region of the active layer corresponding to the first via hole is an n-type heavily doped region.

Optionally, the active layer is made of oxide semiconductor.

Optionally, the region of the active layer corresponding to the first via hole is enabled to be the n-type heavily doped region by treatment with plasma.

Optionally, the plasma is hydrogen ions.

Optionally, an insulation layer is formed between the active layer and the polymer film on array, and the insulation layer is formed with a second via hole, the first via hole being nested in the second via hole.

The present disclosure provides the following advantages. In the embodiment of the present disclosure, the array substrate is provided, comprising the plurality of pixel units arranged in an array. The active layer in the pixel unit partially covers the source and the drain, so as to prevent the polymer film on array from coming in contact with the source. At the same time, the polymer film on array is formed with the first via hole, and the active layer is electrically conductive in the region thereof corresponding to the first via hole, thereby ensuring electrical connection between the pixel electrode and the source. This is favorable for improving yield of the array substrate.

According to a second aspect of the present disclosure, a display device is provided, comprising the above array substrate.

According to a third aspect of the present disclosure, a method for manufacturing an array substrate is provided, comprising the steps of:

forming a drain and a source on a same layer through one and a same patterning procedure;

forming an active layer partially covering the drain and the source on the drain and the source;

forming a polymer film on array, which is provided with a first via hole to expose the active layer partially;

treating a region of the active layer corresponding to the first via hole, such that the region of the active layer is conductive; and forming a pixel electrode, which is electrically connectable to the source through the region of the active layer corresponding to the first via hole.

Optionally, the step of treating a region of the active layer corresponding to the first via hole, such that the region of the active layer is conductive includes: enabling the region of the active layer corresponding to the first via hole to be an n-type heavily doped region by treatment with plasma, such that the region of the active layer is conductive.

Optionally, the plasma is hydrogen ions.

Other features and advantages of the present disclosure will be further explained in the following description, and partly become self-evident therefrom, or be understood through implementation of the present disclosure. The objectives and advantages of the present disclosure will be achieved through the structure specifically pointed out in the description, claims, and the accompanying drawings.

BRIEF DESCRIPTION OF THE DRAWINGS

In order to explicitly illustrate the technical solution of the embodiments of the present disclosure, the embodiments will be described in combination with accompanying drawings, in which.

DETAILED DESCRIPTION OF THE EMBODIMENTS

The present disclosure will be explained by reference to the following detailed description of embodiments taken in connection with the accompanying drawings, whereby it can be readily understood how to solve the technical problem by the technical means according to the present disclosure and achieve the technical effects thereof, and thus the technical solution according to the present disclosure can be implemented. It is important to note that as long as there is no conflict, combinations of the above-described embodiments and of technical features therein are possible, and technical solutions obtained therefrom are intended to be within the scope of the present disclosure.

In an embodiment of the present disclosure, an array substrate is provided, including a plurality of pixel units arranged in an array, each pixel unit being provided with one thin film transistor.

Figure 1:
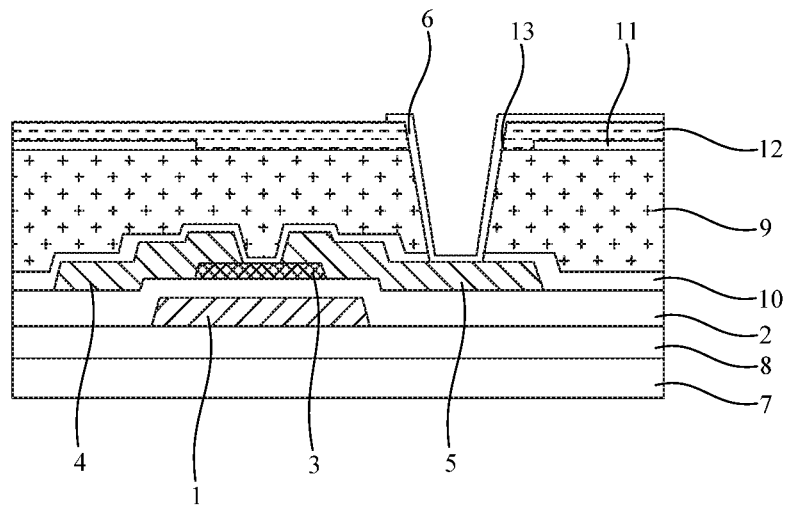
FIG. 1 schematically shows the structure of an array substrate in the prior art.
Figure 2:
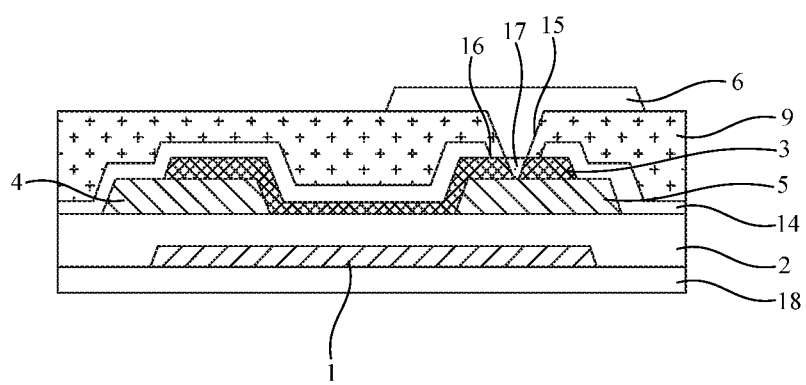
FIG. 2 schematically shows the structure of an array substrate according to an embodiment of the present disclosure.

As shown in FIG. 2, the thin film transistor includes, from the bottom up, a gate 1, a gate insulation layer 2, a drain 4 and a source 5 located in a same layer, and an active layer 3 connecting and partially covering the drain 4 and the source 5. Obviously, the thin film transistor is a bottom gate thin film transistor.

Further, on the thin film transistor, the array substrate includes an insulation layer 14 covering the active layer 3, a polymer film on array 9 located on the insulation layer 14, and a pixel electrode 6 located on the polymer film on array 9, wherein the polymer film on array 9 is formed with a first via hole 15, and the insulation layer 14 is formed with a second via hole 16. The first via hole 15 is nested into the second via hole 16. The active layer 3 is electrically conductive in a region thereof corresponding to the first via hole 15, such that the pixel electrode 6 located on the polymer film on array 9 can be electrically connected to the source 5 through the first via hole 15.

Specifically, plasma treatment can be performed, and the region of the active layer 3 corresponding to the first via hole 15 can be bombarded with positively charged ions such as hydrogen ions and phosphorus ions, so as to enable the region to be an n-type heavily doped region 17. This can enhance conductivity of this region, so that the pixel electrode 6 can be brought into contact with the active layer 3 through the first via hole 15, i.e., the purpose of electrically connecting the pixel electrode 6 to the source 5 located under the active layer 3 can be achieved.

Moreover, the active layer 3 separates the polymer film on array 9 from the source 5, thus preventing generation of a nonconductive substance upon contact of the polymer film on array 9 to the source 5. And the material of the active layer 3 determines that it cannot react with the polymer film on array 9. Thus, the pixel electrode 6 can realize an effective electrical connection to the source 5, and the yield of the display device is thereby ensured.

Specifically, in the embodiment of the present disclosure, the active layer 3 can be made of a material such as amorphous silicon and low-temperature polysilicon. However, in order to improve doping efficiency of the active layer 3, the active layer 3 can be made of oxide semiconductor, wherein the active layer 3 can preferably be made of indium gallium zinc oxide (IGZO).

IGZO is an amorphous oxide containing indium, gallium, and zinc. With a carrier mobility 20 to 30 times that of amorphous silicon, IGZO can greatly improve charging and discharging rates of a TFT to the pixel electrode 6, and improve response speed of a pixel, so as to achieve a greater refresh rate. Meanwhile, faster response also significantly improves row scan rate of the pixel, thus rendering ultra-high resolution possible in the display device.

Figure 3:
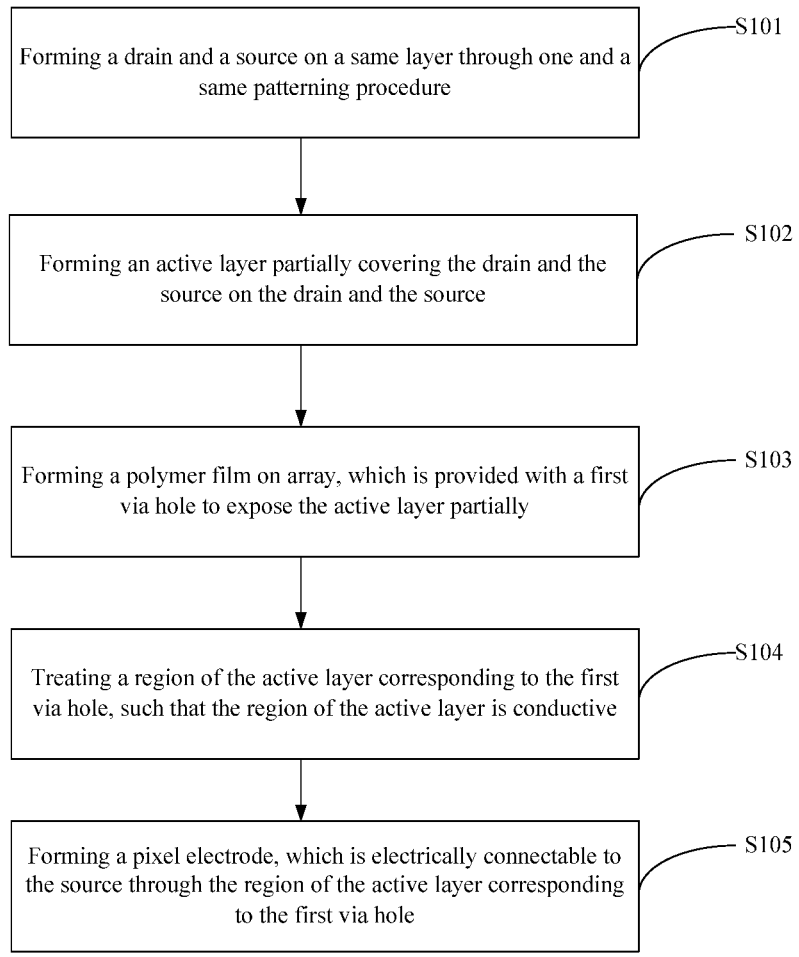
FIG. 3 schematically shows a flow chart of a method for manufacturing the array substrate according to the embodiment of the present disclosure.

In order to manufacture the above-described array substrate, in an embodiment of the present disclosure, a method for manufacturing the above-described array substrate is further provided, as shown in FIG. 3. The method comprises the following steps.

In step S101, a drain and a source are formed on a same layer through one and a same patterning procedure.

In step S102, an active layer partially covering the drain and the source is formed on the drain and the source.

In step S103, a polymer film on array provided with a first via hole is formed, to expose the active layer partially.

In step S104, a region of the active layer corresponding to the first via hole is treated, such that the region of the active layer is conductive.

In step S105, a pixel electrode is formed, the pixel electrode being electrically connectable to the source through the region of the active layer corresponding to the first via hole.

The array substrate provided in the embodiment of the present disclosure can be obtained specifically by the following manufacturing steps.

A first metal layer for manufacturing the structures of the gate 1, a gate line, and the like is formed on a base 18 by physical vapor deposition (PVD), followed by exposure through a corresponding mask plate, and procedures such as development, wet etching, and stripping to form the gate 1.

The base 18 may be a base substrate or a buffer layer disposed on the base substrate. The buffer layer can provide an ideal isolation buffer between the gate 1 and the base substrate, and can enhance adhesion between the gate 1 and the base.

Subsequently, the gate insulation layer 2 for insulating the gate 1, and the drain 4 and the source 5 is formed on the gate 1 by coating or the like. The gate insulation layer 2 may be made of an insulating material such as silicon nitride ($Si_xN_y$) or silicon oxide ($Si_xO_y$). After the formation of the gate insulation layer 2, a second metal layer is formed on the gate insulation layer 2 through a PVD procedure again. The second metal layer is used for forming the structures such as the drain 4 and the source 5 that are provided on the same layer, and a data line. The second metal layer is exposed through a corresponding mask plate, followed by procedures such development, wet etching, and stripping to manufacture the structures such as the drain 4, the source 5, and the data line.

Figure 4:
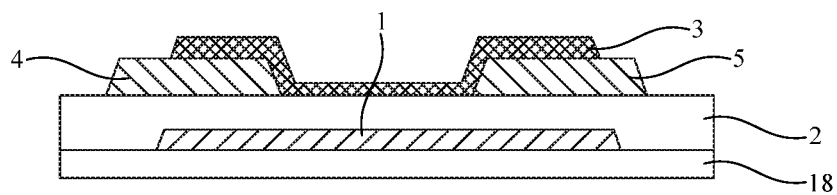
FIGS. 4 to 7 schematically show manufacturing procedures of the array substrate of FIG. 2.

After the drain 4 and the source 5 are manufactured, the active layer 3 is manufactured to obtain the array substrate as shown in FIG. 4. An IGZO layer is formed on the drain 4 and the source 5 through PVD, followed by exposure through a corresponding mask plate, and procedures such as development, wet etching, and stripping, to obtain a pattern of the active layer 3, wherein the active layer 3 has a thickness in the range from 40 to 100 nm, and has a large contact area with the drain 4 and the source 5 to cover a majority of the drain 4 and the source 5. With this structure, not only effective contact between the active layer 3 and the drain 4 and the source 5 can be ensured, but also the source 5 can be protected from coming in contact with the polymer film on array 9.

Figure 5:
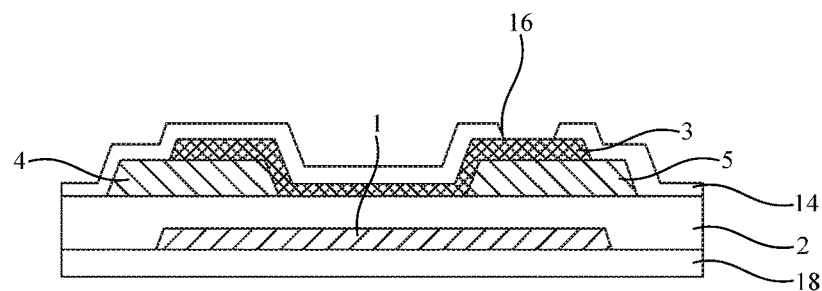

Afterwards, the insulation layer 14 is formed on the active layer 3 by plasma enhanced chemical vapor deposition (PECVD), and the insulation layer 14 can also be made of a conventional insulating material such as silicon nitride and silicon oxide. Since the insulation layer 14 is insulative and cannot be electrically conductive, in order to allow the pixel electrode 6 to be electrically conductive with the source 5, it is necessary to form the second via hole 16 by procedures such as exposure, development, and dry etching performed on the insulation layer 14 through a corresponding mask plate, as shown in FIG. 5.

Since the active layer 3 in this embodiment covers the majority of the source 5, the second via hole 16 cannot expose the source 5, but exposes the active layer 3 covering the source 5.

After the second via hole 16 is formed, the polymer film on array 9 is formed on the insulation layer 14 by a coating procedure or the like. In this embodiment, the polymer film on array 9 is formed on the insulation layer 14 in order to increase an aperture ratio of the display device. Due to the existence of the polymer film on array 9, the pixel electrode 6 may extend on a portion of the data line, thereby increasing the aperture ratio of the display device. This is because the polymer film on array 9 has a sufficient thickness to prevent an excessive parasitic capacitance between the pixel electrode 6 and the data line, which would otherwise deteriorate the display effect of the display device.

Although the second via hole 16 is formed in the insulation layer 14, since the second via hole 16 exposes the active layer 3 covering the source 5, the polymer film on array 9 cannot be in contact with the source 5 through the second via hole 16 to react with the source 5 and form a nonconductive substance. In addition, since the polymer film on array 9 does not react with the active layer 3 made of IGZO, the polymer film on array 9 will not affect characteristics of the active layer 3.

Figure 6:
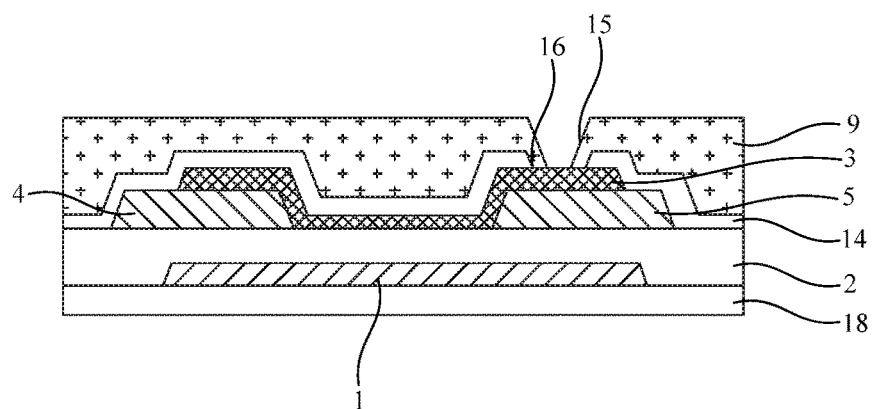

Since the polymer film on array 9 is electrically nonconductive, and the pixel electrode 6 is provided on the polymer film on array 9, in order for the pixel electrode 6 to be electrically connected to the source 5, it is necessary to provide the polymer film on array 9 with the first via hole 15, which is nested in the second via hole 16, to merely expose a portion of the active layer 3 also, as shown in FIG. 6.

Figure 7:
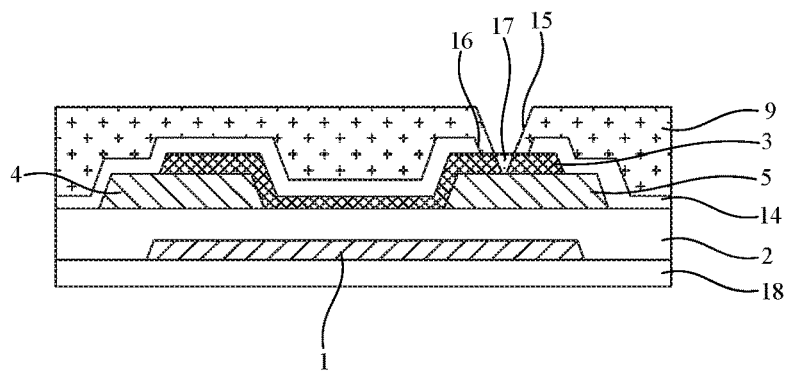

Obviously, if the active layer 3 is not specifically treated, since the active layer 3 is not made of a conductive material, the pixel electrode 6 in direct contact with the active layer 3 still cannot be electrically connected to the source 5 in an effective manner. Therefore, in the embodiment of the present disclosure, the exposed portion of the active layer 3 is subjected to treatment of hydrogen ion bombardment based on the first via hole 15 provided in the polymer film on array 9, so that this portion becomes the n-type heavily doped region 17, as shown in FIG. 7. The conductivity of this portion of the active layer 3 can be thereby improved. Thus, after the pixel electrode 6 comes into contact with the active layer 3 through the first via hole 15, good electrical connection between the pixel electrode 6 and the source 5 can be achieved through the conductive n-type heavily doped region 17.

Finally, on the polymer film on array 9, an indium tin oxide (ITO) layer for preparing the pixel electrode 6 is formed by the PVD procedure again. Subsequently, the pattern of the pixel electrode 6 is obtained by exposure through a corresponding mask plate, and procedures such as development, wet etching, and stripping, so as to obtain the array substrate as shown in FIG. 2.

To conclude the above, in the embodiment of the present disclosure, the array substrate is provided, comprising the plurality of pixel units arranged in an array, the active layer in the pixel unit partially covering the source and the drain, to prevent the polymer film on array from coming in contact with the source. At the same time, the polymer film on array is formed with the first via hole, and the active layer is electrically conductive in the region thereof corresponding to the first via hole, thereby ensuring the electrical connection between the pixel electrode and the source. This is favorable for improvement of the yield of the array substrate.

In the embodiment of the present disclosure, the display device is further provided, including the above-described array substrate. The display device can be a television, a display, a mobile phone, a tablet computer, or the like.

The above embodiments are described only for better understanding, rather than restricting, the present disclosure. Any person skilled in the art can make amendments to the implementing forms or details without departing from the spirit and scope of the present disclosure. The scope of the present disclosure should still be subject to the scope defined in the claims.

The invention claimed is:

1. A method for manufacturing an array substrate, comprising the steps of:
    forming a drain and a source on a same layer through one and a same patterning procedure;
    forming an active layer partially covering an upper surface of the drain and an upper surface of the source on the same layer of the drain and the source;
    forming a polymer film on array covering the active layer, and forming a first via hole on the polymer film on array to expose the active layer partially; treating a region of the active layer corresponding to the first via hole, such that the region of the active layer is conductive; and
    forming a pixel electrode directly disposed on the polymer film on array, which is electrically connected to the source through the region of the active layer corresponding to the first via hole.

2. The method of according to claim 1, wherein the step of treating a region of the active layer corresponding to the first via hole, such that the region of the active layer is conductive includes: enabling the region of the active layer corresponding to the first via hole to be an n-type heavily doped region by treatment with plasma, such that the region of the active layer is conductive.

3. The method according to claim 2, wherein the plasma is hydrogen ions.

\* \* \* \* \*